(12) United States Patent
Wu et al.

(10) Patent No.: US 8,084,328 B2
(45) Date of Patent: Dec. 27, 2011

(54) SEMICONDUCTOR DEVICE INCLUDING I/O OXIDE NITRIDED CORE OXIDE ON SUBSTRATE

(75) Inventors: Zhen-Cheng Wu, Hsinchu (TW); Yung-Cheng Lu, Taipei (TW); Pi-Tsung Chen, Tainan County (TW); Ying-Tsung Chen, Chiayi (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/923,889

(22) Filed: Oct. 13, 2010

(65) Prior Publication Data

US 2011/0081758 A1 Apr. 7, 2011

Related U.S. Application Data

(62) Division of application No. 11/181,915, filed on Jul. 15, 2005, now Pat. No. 7,834,405.

(51) Int. Cl.
*H01I 21/8234* (2006.01)
(52) U.S. Cl. .. 438/276; 438/981; 438/591; 257/E21.625
(58) Field of Classification Search .................. 438/276, 438/216, 287, 591, 981; 257/E21.625, E29.241
See application file for complete search history.

(56) References Cited

U.S. PATENT DOCUMENTS

| | | | |
|---|---|---|---|
| 6,756,646 B2 | 6/2004 | Buchanan et al. | |
| 6,821,868 B2 | 11/2004 | Cheng et al. | |
| 7,183,165 B2 * | 2/2007 | Khamankar et al. | 438/287 |
| 2006/0276054 A1 | 12/2006 | Lakshmanan et al. | |
| 2007/0013009 A1 | 1/2007 | Wu et al. | |
| 2007/0207572 A1 * | 9/2007 | Varghese et al. | 438/128 |
| 2007/0262374 A1 * | 11/2007 | Higashi et al. | 257/324 |

OTHER PUBLICATIONS

Mickler et al., "A Charge Damage Study Using an Electron Beam Low k Treatment", IEEE International Interconnect Technology Conference, 2004.

Cheung, "Plasma Charging Damage to Gate Dielectric—Past, Present and Future", IEEE Proceedings of 9$^{th}$ IPFA, 2002, pp. 237-241.

Chen et al., "Characterization of Plasma Damage in Plasma Nitrided Gate Dielectrics for Advanced CMOS Dual Gate Oxide Process", 7$^{th}$ International Symposium on Plasma-and Process-Induced Damage, Jun. 2002, pp. 41-44.

Chang et al., "Effects of Plasma-Induced Damage to Ultrathin (<1.5 nm) Gate Dielectric on Equivalent Oxide Thickness Downscaling Using Plasma Nitridation Process", IEEE 2003, pp. 130-133.

(Continued)

*Primary Examiner* — Thanh Nguyen
(74) *Attorney, Agent, or Firm* — Finnegan, Henderson, Farabow, Garrett & Dunner, LLP

(57) ABSTRACT

A semiconductor device includes a semiconductor substrate, wherein the semiconductor substrate includes a core area for core circuits and a peripheral area for peripheral circuits. The semiconductor device includes a core oxide on the semiconductor substrate in the core area, a portion of the core oxide being nitrided, a first polysilicon pattern on the core oxide, an I/O oxide including pure oxide on the semiconductor substrate in the peripheral area, and a second polysilicon pattern on the I/O oxide.

20 Claims, 10 Drawing Sheets

OTHER PUBLICATIONS

Min et al., "Impact of Process-Induced Damage on MOSFET Reliability and Suppression of Damage by the Use of NO-Based Oxynitride Gate Dielectrics", VLSI Technology, Systems and Applications, 1995, Proceedings of Technical Papers, 1995 International Symposium May 31—Jun. 2, 1995, pp. 273-276.

Chen et al., "Plasma-Induced Charging Damage in Ultrathin (3-nm) Gate Oxides", IEEE Transactions on Electron Devices, vol. 47, No. 7, Jul. 2000, pp. 1355-1360.

Chen et al., "Plasma Process Induced Damage in Sputtered TiN Metal Gate Capacitors with Ultra-Thin Nitrided Oxide", Proceedings of the $5^{th}$ International Symposium on Plasma Process-Induced Damage, May 2000, pp. 117-120.

Kapila et al., "Modeling and Optimization of Oxynitride Gate Dielectrics Formation by Remote Plasma Nitridation of Silicon Dioxide", Journal of the Electrochemical Society, vol. 146, No. 3, Mar. 1999, pp. 1111-1116.

Huang et al., "Base Oxide Scaling Limit of Thermally-Enhanced Remote Plasma Nitridation (TE-RPN) Process for Ultra-thin Gate Dielectric Formation", IEEE 2001, pp. 179-182.

Ishikawa et al., "Nitride-Sandwiched-Oxide Gate Insulator for Low Power CMOS", IEEE 2002, IEDM, pp. 869-872.

Gusev et al., "Growth and Characterization of Ultrathin Nitrided Silicon Oxide Films", IBM Journal of Research and Development., vol. 43, May 1999, pp. 265-286.

Chen et al., "Thermally-Enhanced Remote Plasma Nitrided Ultrathin (1.65nm) Gate Oxide with Excellent Performances in Reduction of Leakage Current and Boron Diffusion", IEEE Electron Device Letters, vol. 22, No. 8, Aug. 2001, pp. 378-380.

Young et al., "A 0.13 um CMOS Technology with 193 nm Lithography and Cu/Low-k for High Performance Applications", IEEE 2000, IEDM, pp. 563-566.

Hattangady et al., "Remote Plasma Nitrided Oxides for Ultrathin Gate Dielectric Applications", SPIE Conference on Microelectronic Device Technology II, vol. 3506, Sep. 1998, pp. 30-40.

Green et al., "Ultrathin (<4 nm) $SiO_2$ and Si-O-N Gate Dielectric Layers for Silicon Microelectronics: Understanding the Processing, Structure, and Physical and Electrical Limits", Journal of Applied Physics, vol. 90, No. 5, Sep. 2001, pp. 2057-2121.

Chen et al., "Downscaling Limit of Equivalent Oxide Thickness in Formation of Ultrathin Gate Dielectric by Thermal-Enhanced Remote Plasma Nitridation", IEEE Transactions on Electron Devices, vol. 49, No. 5, May 2002, pp. 840-846.

M.C. Yu et al., "Base Oxide Scaling Limit of Thermally-Enhanced Remote Plasma Nitridation (TE-RPN) Process for Ultra-thin Gate Dielectric Formation", IEEE 2001, pp. 179-182.

* cited by examiner

SEMICONDUCTOR DEVICE INCLUDING I/O OXIDE NITRIDED CORE OXIDE ON SUBSTRATE

This is a division of application Ser. No. 11/181,915, filed Jul. 15, 2005 now U.S. Pat. No. 7,834,405, the entire content of which is incorporated herein by reference.

FIELD OF THE INVENTION

This invention relates in general to a semiconductor device and, more particularly, to a semiconductor device including I/O oxide and nitrided core oxide on a substrate, and the method for forming the same.

BACKGROUND OF THE INVENTION

A semiconductor integrated circuit (IC) generally includes core circuits for performing certain functions and peripheral circuits for communicating the performed functions with external circuits. The semiconductor IC often has a dual gate oxide structure, because MOS transistors provided in the core circuits and peripheral circuits may have different requirements for thicknesses of gate oxides thereof. For example, an MOS transistor in a core circuit requires a very thin gate oxide (core oxide) to achieve a strong capacitive effect of the gate oxide and therefore good control over the channel region by the gate of the MOS transistor. In contrast, an MOS transistor in a peripheral circuit may require a relatively thicker gate oxide (I/O oxide) capable of sustaining a higher voltage applied to the peripheral circuit.

Because a leakage current through a gate oxide increases exponentially as the thickness of the gate oxide decreases, the thickness of the gate oxide of an MOS transistor cannot be decreased indefinitely. A conventional technique for improving control over the channel region by the gate of the MOS transistor is through plasma nitridation of the gate oxide to increase the dielectric constant thereof, as a result of which the capacitive effect of the gate oxide is enhanced and the control over the channel region by the gate may be improved.

A semiconductor IC also includes several layers of metals to provide contact among circuit elements of the IC and between the IC and external circuits. Inter-metal dielectric (IMD) layers are provided between the metal layers to isolate the metal layers from each other. To minimize the capacitive effect of the IMDs, thereby maximizing a speed of the semiconductor IC, it is often desirable to lower the dielectric constant (k) of the IMDs. Electron beams (e-beams) are frequently used to cure the IMDs to achieve low-k or extra-low-k (ELK) IMDs.

FIGS. 1A-1D illustrate a process of forming a semiconductor device 100 having a conventional dual gate oxide structure.

In FIG. 1A, a semiconductor substrate 102 is provided. A core area 104 is defined as a portion of semiconductor substrate 102 for core circuits. A peripheral area 106 is defined as a portion of semiconductor substrate 102 for peripheral circuits. A layer of core oxide 108 as a gate oxide of a core MOS transistor is formed on semiconductor substrate 102 in core area 104. A layer of I/O oxide 110 as a gate oxide of a peripheral MOS transistor is formed on semiconductor substrate 102 in peripheral area 106. As shown in FIG. 1A, I/O oxide 110 is substantially thicker than core oxide 108. A post-oxidation anneal in nitric oxide (NO) is performed to reduce interface states at the interface between semiconductor substrate 102 and core oxide 108 and I/O oxide 110.

In FIG. 1B, a plasma nitridation process is performed to increase the dielectric constant of core oxide 108 and I/O oxide 110. As a result, a portion 108' of core oxide 108 and a portion 110' of I/O oxide 110 are nitrided. Then a layer of polysilicon 112 is formed on core oxide 108 to serve as the gate of the core MOS transistor and a layer of polysilicon 114 is formed on I/O oxide 110 to serve as the gate of the peripheral MOS transistor.

In FIG. 1C, an inter-layer dielectric (ILD) layer 116 is deposited on polysilicon 112 and 114 and contact holes 118 are formed in ILD layer 116. A first layer of metal is deposited on ILD layer 116 and filled in contact holes 118, and patterned to form first metal patterns 120 to provide contact to polysilicon 112 and 114. An etch stop layer (ESL) 122 is provided on first metal patterns 120. An IMD layer 124 is provided on ESL 122 and is cured by e-beam to achieve an extra low dielectric constant, e.g., below 2.5.

In FIG. 1D, first vias 126 are formed in IMD layer 124 and ESL 122 by separate etchings of IMD layer 124 and ESL 122. A second layer of metal is deposited on IMD layer 124 and filled in first vias 126, and patterned to form second metal patterns 128.

Conventional steps may be performed before, between, or after the above steps to complete semiconductor device 100, such as formation of source and drain regions, formation of additional metal layers, and packaging, etc.

A problem associated with the above-described process for forming semiconductor device 100 is discussed below.

In the plasma nitridation process of core oxide 108 and I/O oxide 110, nitrogen introduced into core oxide 108 and I/O oxide 110 breaks Si—O bonds in the oxide and results in sub-oxide formation at the interface between semiconductor substrate 102 and core oxide 108 and I/O oxide 110. Consequently, traps are formed at the interface between semiconductor substrate 102 and core oxide 108 and I/O oxide 110, and a reliability of core oxide 108 and I/O oxide 110 is degraded.

During the subsequent e-beam curing process of IMD layer 124, beams of electrons are directed at IMD layer 124. The electrons may penetrate through IMD layer 124 and ESL 122 and accumulate at first metal layer 120 and later-formed vias 126.

The charge accumulated on first metal patterns 120 and vias 126 due to the e-beam curing of IMD layer 124 dissipates through vias 118 and polysilicon layers 112 and 114. In peripheral area 106, I/O oxide 110 is thick and electron tunneling does not occur. The charge accumulated on one side of I/O oxide 110, i.e., in polysilicon layer 114, coupled with the traps on the other side thereof, i.e., at the interface between semiconductor substrate 102 and I/O oxide 110, degrades performance of the peripheral transistor. For example, a leakage current, a threshold voltage, and a noise of the peripheral transistor may increase. Such damage caused by the accumulated charge is generally referred to as plasma-induced damage (PID) and sometimes as BEOL (back-end-of-line) PID. Here BEOL refers to the processing steps following the formation of first metal patterns 120, in contrast with FEOL (front-end-of-line), which refers to the processing steps prior to the formation of first metal patterns 120. In core area 104, because core oxide 108 is very thin, e.g., 10-20 Å, the charge resulting from e-beam curing can tunnel through core oxide 108 and is discharged at semiconductor substrate 102. As a result, the BEOL PID problem is less severe in core area 104.

As discussed above, due to the plasma nitridation process, semiconductor device 100, especially peripheral area 106 thereof, suffers a serious BEOL PID problem. To minimize the amount of charge accumulated on first metal patterns 120 and vias 126, the e-beam curing process of IMD 124 must be performed within a narrow processing window. If the processing window is so narrow that e-beam curing is impractical, alternative solutions for achieving extra-low-k IMD 124 must be found, which may delay production.

Depending on the dimensions of the first metal patterns 120 and first vias 126, the amount of electrons stored therein differs. FIGS. 2A and 2B respectively show the effect of the sizes of the first metal patterns and the first vias on the performance of peripheral MOS transistors formed using the above-described conventional process. In both FIGS. 2A and 2B, the peripheral MOS transistors formed and measured have a nominal operation voltage of 2.5V, the abscissa is yield, and the ordinate is the gate leakage current. The numbers 13, 14, 15, 16, 19, and 20 refer to batch numbers of the MOS transistors formed. A dashed vertical line indicates acceptable yield (approximately 95%) in each of FIGS. 2A and 2B. As shown in FIGS. 2A and 2B, a so-called tailing of the gate leakage current occurs above the acceptable yield, i.e., the gate leakage current increases significantly. Moreover, the gate leakage current is higher when antenna ratios (AR) are higher, wherein an antenna ratio is defined as the ratio of the size of the metal layer or the size of the via to the size of the gate oxide of the MOS transistor.

SUMMARY OF THE INVENTION

Consistent with embodiments of the present invention, there is provided a semiconductor device including a semiconductor substrate, wherein the semiconductor substrate includes a core area for core circuits and a peripheral area for peripheral circuits. The semiconductor device includes a core oxide on the semiconductor substrate in the core area, a portion of the core oxide being nitrided, a first polysilicon pattern on the core oxide, an I/O oxide including pure oxide on the semiconductor substrate in the peripheral area, and a second polysilicon pattern on the I/O oxide.

Consistent with embodiments of the present invention, there is provided a method for forming a semiconductor device that includes providing a semiconductor substrate, defining a core area of the semiconductor substrate for core circuits and a peripheral area for peripheral circuits, forming and patterning a first layer of oxide to form a core oxide on the semiconductor substrate in the core area, forming and patterning a second layer of oxide to form an I/O oxide on the semiconductor substrate in the peripheral area, forming a polysilicon pattern on the I/O oxide, and nitridizing the core oxide by performing a plasma nitridation process using the polysilicon pattern on the I/O oxide as a mask.

Consistent with embodiments of the present invention, there is provided a method for forming a semiconductor device that includes providing a semiconductor substrate, defining a core area of the semiconductor substrate for core circuits and a peripheral area for peripheral circuits, forming and patterning a first layer of oxide to form a plurality of core oxide patterns on the semiconductor substrate in the core area, forming and patterning a second layer of oxide to form a plurality of I/O oxide patterns on the semiconductor substrate in the peripheral area, forming a plurality of polysilicon patterns on the I/O oxide patterns, performing a post-oxidation anneal in nitric oxide (NO) environment, and nitridizing the core oxide patterns by performing a plasma nitridation process using the polysilicon patterns as a mask.

Additional features and advantages of the invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the features, advantages, and principles of the invention.

In the drawings.

DESCRIPTION OF THE EMBODIMENTS

Reference will now be made in detail to the present embodiments of the invention, examples of which are illustrated in the accompanying drawings. Wherever possible, the same reference numbers will be used throughout the drawings to refer to the same or like parts.

Consistent with embodiments of the present invention, there is provided a novel dual gate oxide structure of semiconductor device, and a method for forming the same, that overcomes one or more problems or disadvantages of the conventional structure.

Figure 1A:
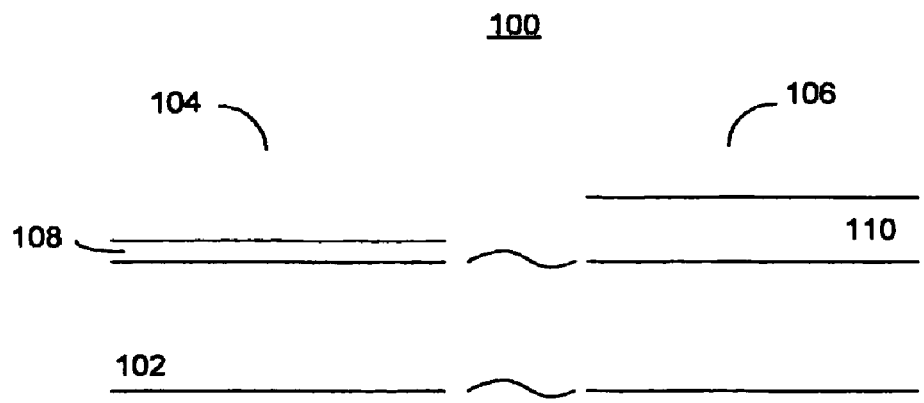
FIGS. 1A-1D illustrate a method for forming a conventional semiconductor device having a dual gate oxide structure.
Figure 1B:
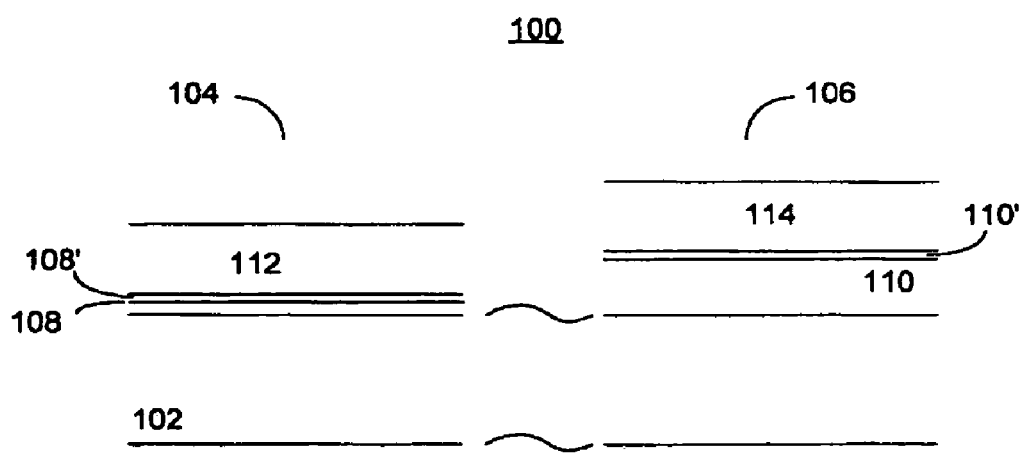
Figure 1C:
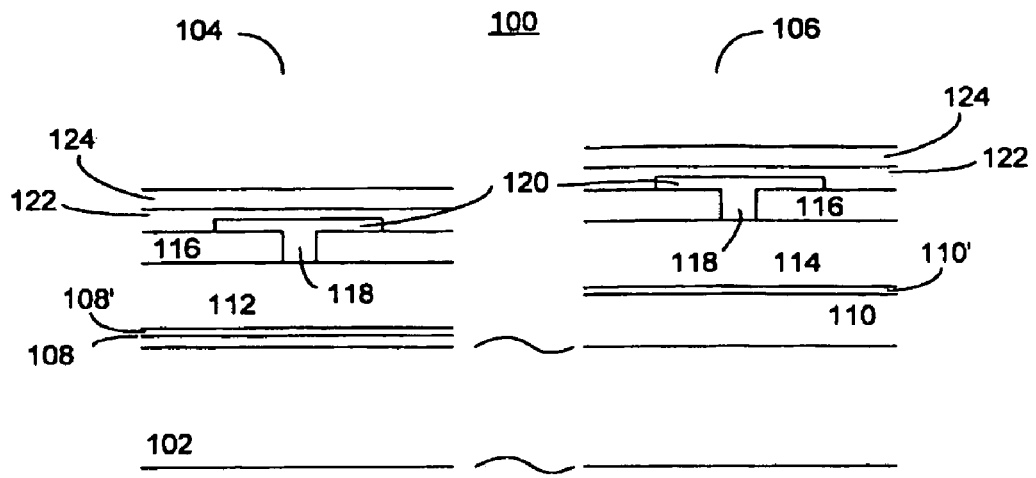
Figure 1D:
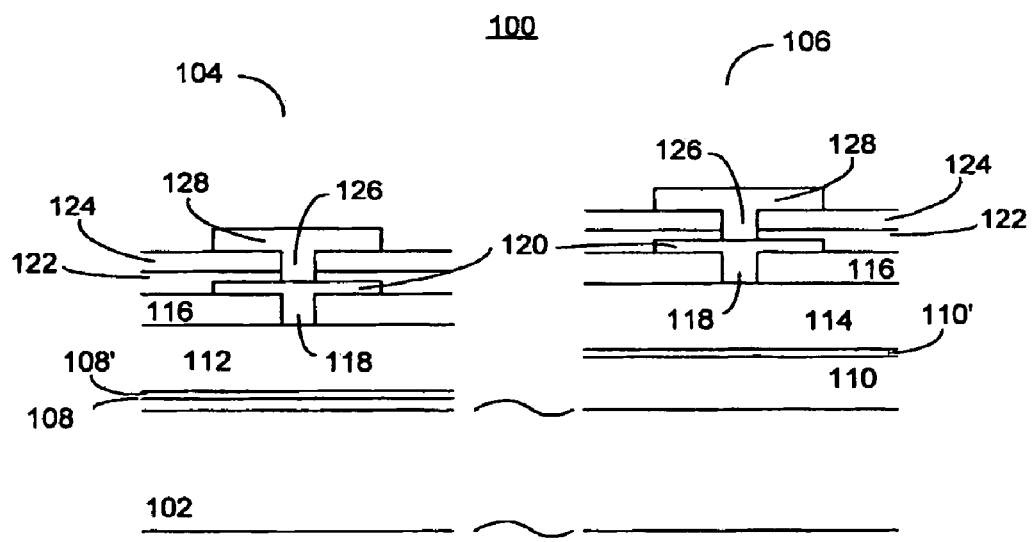
Figure 2A:
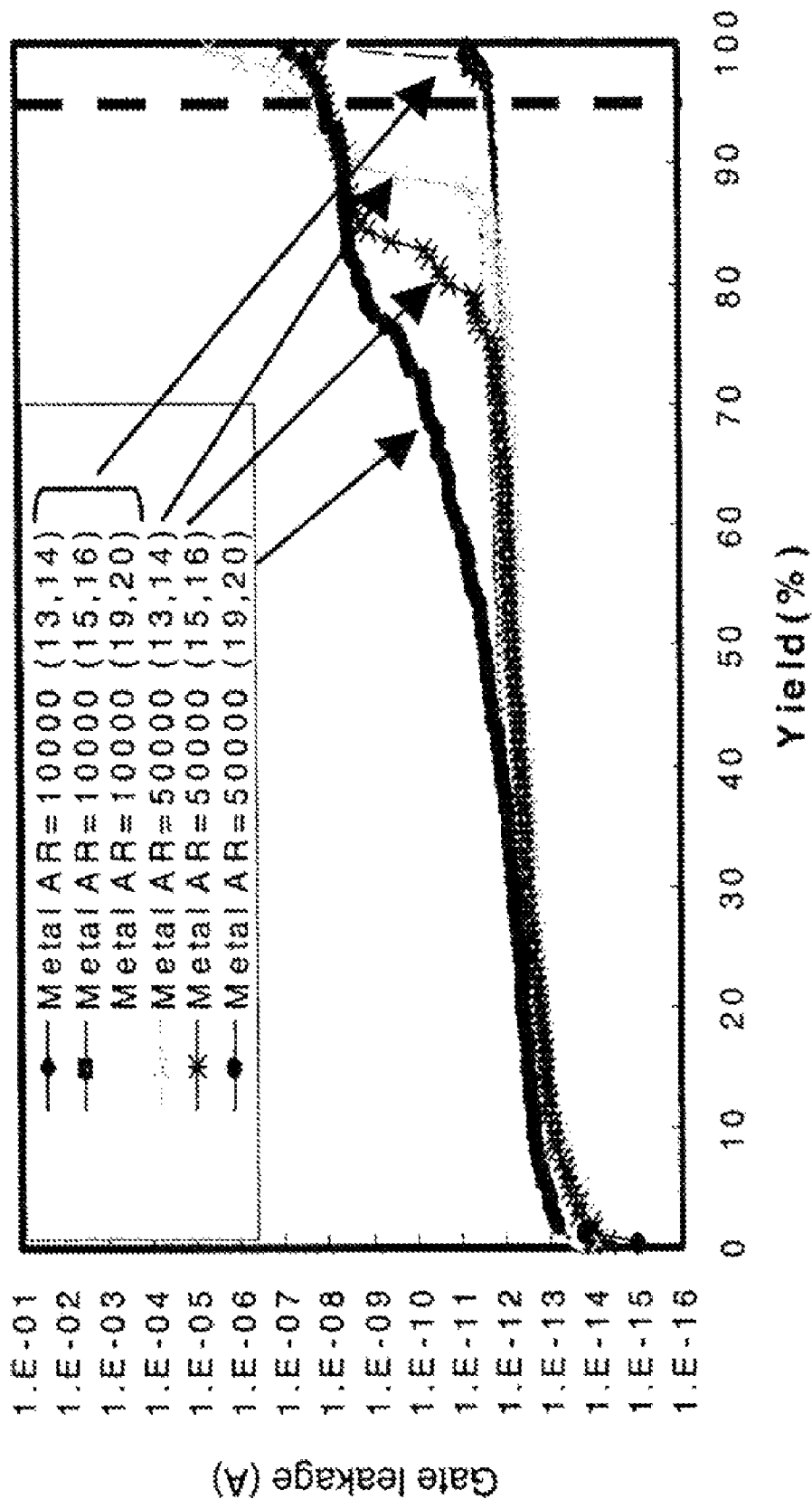
FIGS. 2A-2B show gate leakage currents of conventional MOS transistors formed using the method of FIGS. 1A-1D.
Figure 2B:
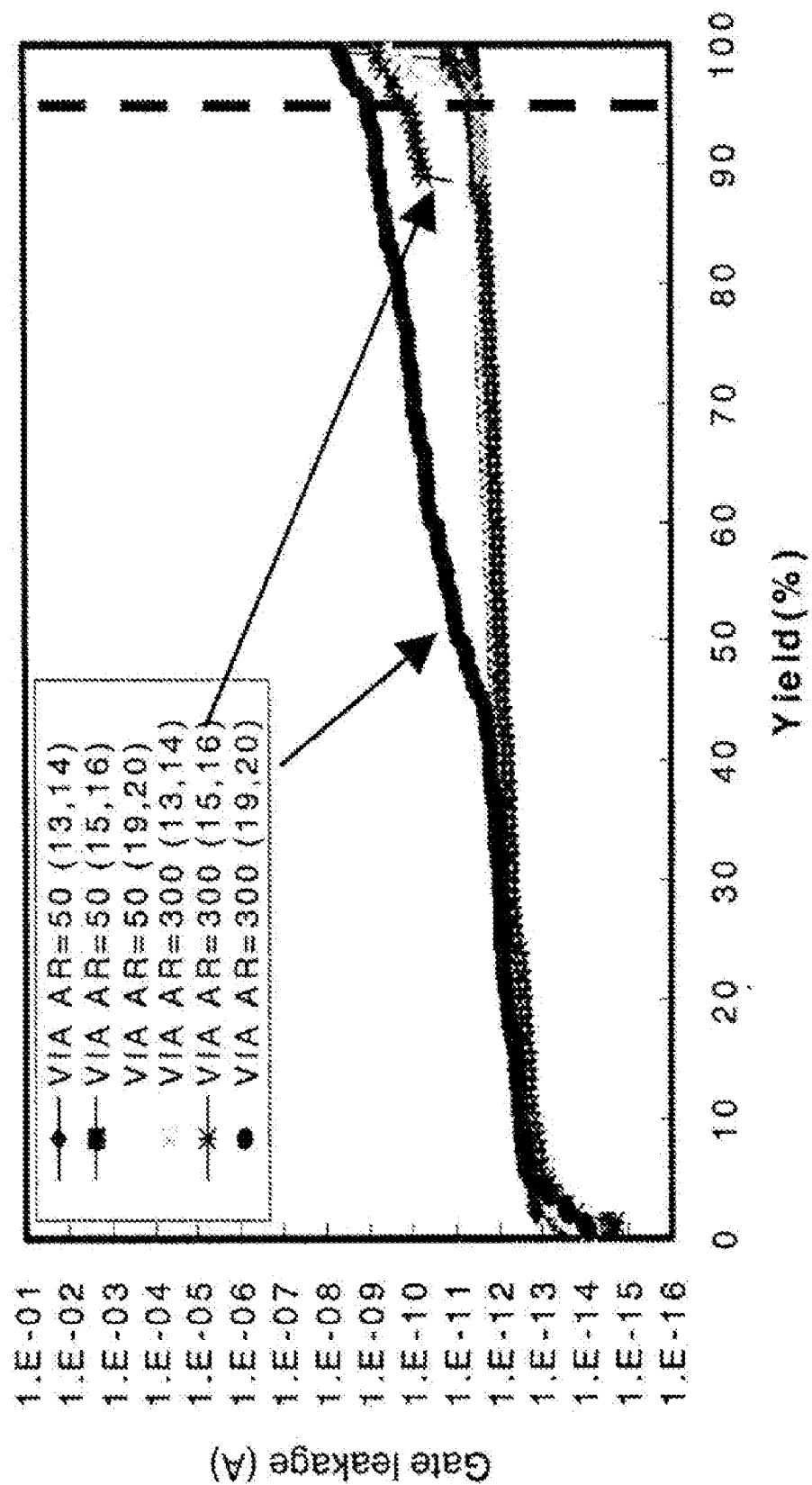
Figure 3:
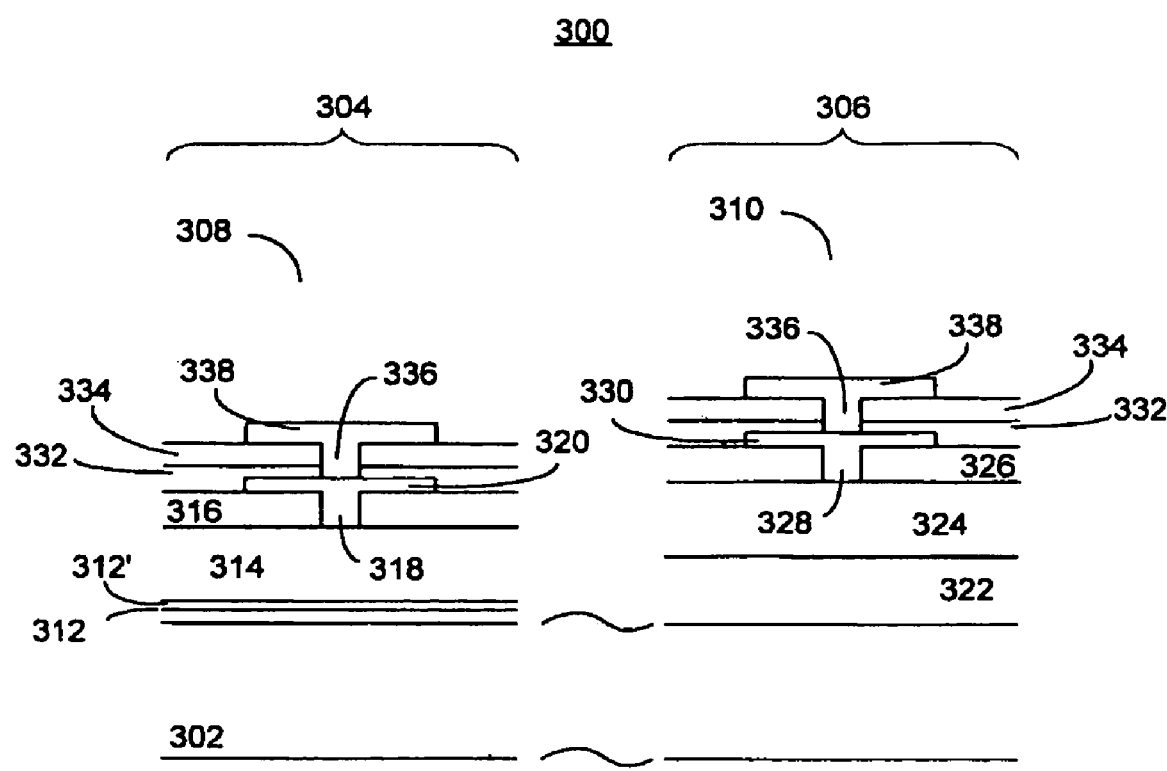
FIG. 3 shows a semiconductor device consistent with embodiments of the present invention.

FIG. 3 illustrates part of a semiconductor device 300 consistent with embodiments of the present invention. As shown in FIG. 3, semiconductor device 300 is formed on a semiconductor substrate 302. Semiconductor substrate 302 includes a core area 304 for core circuits and a peripheral area 306 for peripheral circuits. A core transistor 308 is formed in core area 304 and a peripheral transistor 310 is formed in peripheral area 306.

Core transistor 308 includes a gate oxide or core oxide 312 formed on semiconductor substrate 302, which further includes a nitrided portion 312', and a gate 314 comprising polysilicon formed on gate oxide 312. Gate oxide 312 has a thickness of about 10-20 Å. Core transistor 308 may further include an inter-layer dielectric (ILD) layer 316 formed on polysilicon gate 314. ILD layer 316 has a contact hole 318 formed therein. A first metal pattern 320 formed on ILD layer 316 and in contact hole 318 provides contact to polysilicon gate 314.

Peripheral transistor 310 includes a gate oxide or I/O oxide 322 formed on semiconductor substrate 302 and a gate 324 comprising polysilicon formed on gate oxide 322. Gate oxide 322 has a thickness of about 50 Å or more. Peripheral transistor 310 may further include an ILD layer 326 formed on polysilicon gate 324. ILD layer 326 has a contact hole 328 formed therein. Peripheral transistor 310 may also include a first metal pattern 330 formed on ILD layer 326 and in contact hole 328 to provide contact to polysilicon gate 324.

An etch stop layer (ESL) 332 is provided on first metal patterns 320 and 330 and on portions of ILD layers 316 ad 326. An extra-low-k IMD layer 334 is provided on ESL 332. In one aspect, IMD layer 334 comprises organosilicate glass (OSG) and has a dielectric constant below 2.5. First vias 336 are formed in IMD layer 334 and ESL 332. Second metal patterns 338 are provided on IMD layer 334 and in first vias 336 to provide contact to first metal patterns 320 and 330.

A method for forming semiconductor device 300 is described below with reference to FIGS. 4A-4F.

Figure 4A:
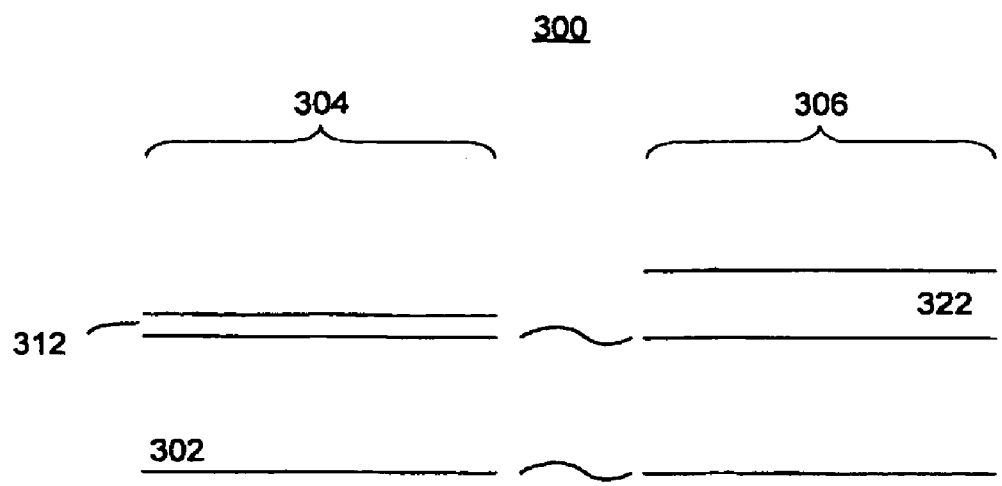
FIGS. 4A-4F illustrate a method for forming the semiconductor device of FIG. 3.

In FIG. 4A, semiconductor substrate 302 is provided. Core oxide 312 and I/O oxide 322 are respectively formed in core area 304 and peripheral area 306 by depositing and patterning oxide layers.

Figure 4B:
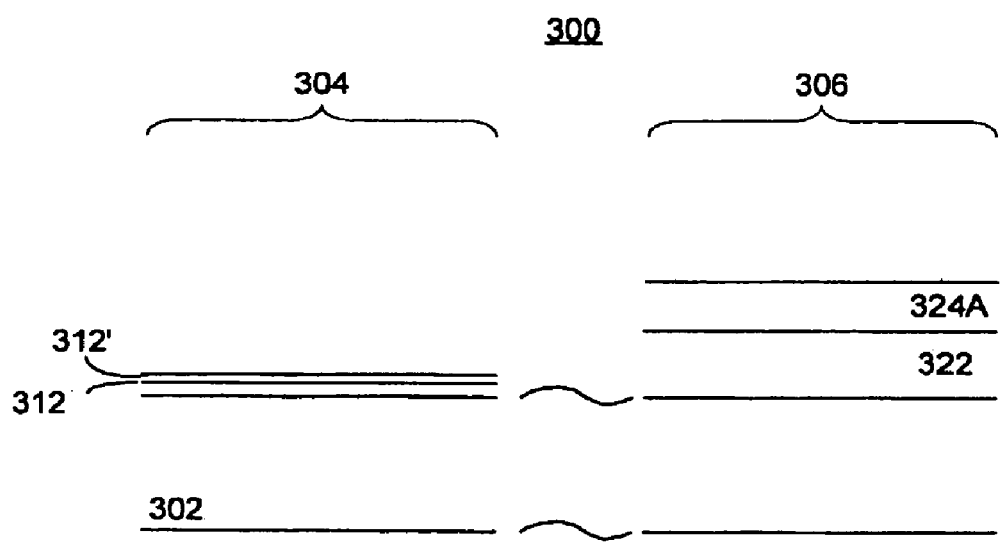

In FIG. 4B, a layer of polysilicon is deposited and patterned to form a polysilicon pattern 324A covering I/O oxide 322. A post-oxidation anneal in nitric oxide (NO) is performed to reduce interface states. Then, using polysilicon pattern 324A as a mask, a plasma nitridation process is performed to nitride core oxide 312. As a result, a portion 312' of core oxide 312 is nitrided and the dielectric constant of core oxide 312 is increased.

Figure 4C:
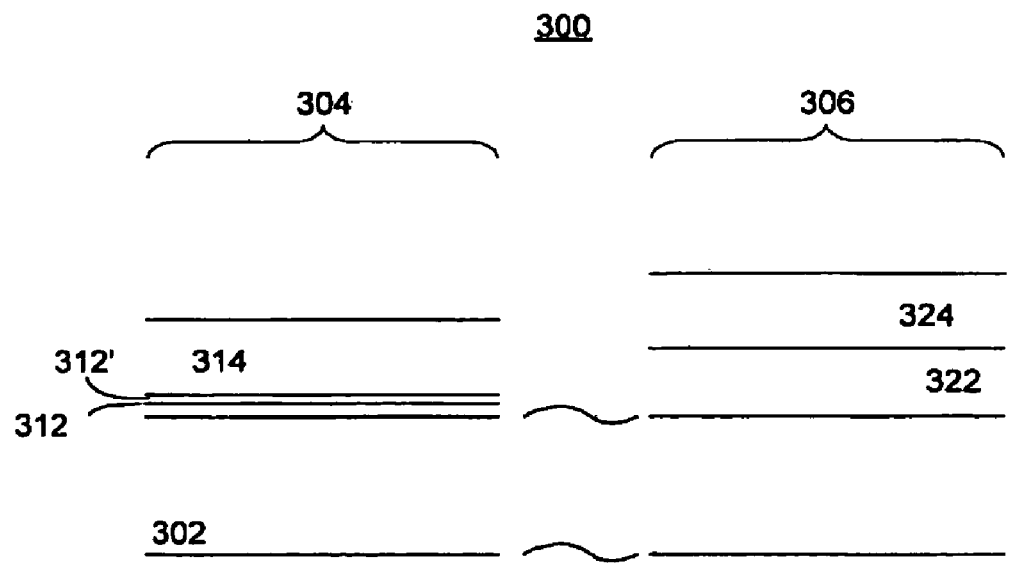

In FIG. 4C, another layer of polysilicon is deposited on both core oxide 312 and I/O oxide 322, forming polysilicon gate 314 and, together with polysilicon pattern 324A, forming polysilicon gate 324.

Figure 4D:
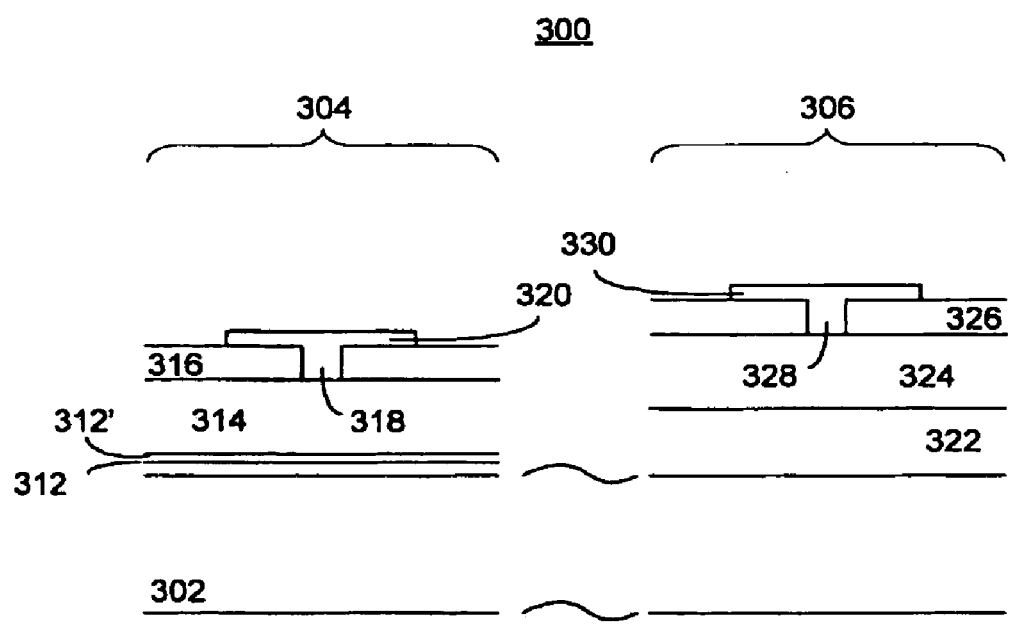

In FIG. 4D, an inter-layer dielectric (ILD) layer is deposited on polysilicon gates 314 and 324 and patterned to form ILD layers 316 and 326 and contact holes 318 and 328. A first layer of metal is deposited on ILD layers 316 and 326 and in contact holes 318 and 328, and patterned to form first metal patterns 320 and 330, exposing portions of ILD layers 316 and 326.

Figure 4E:
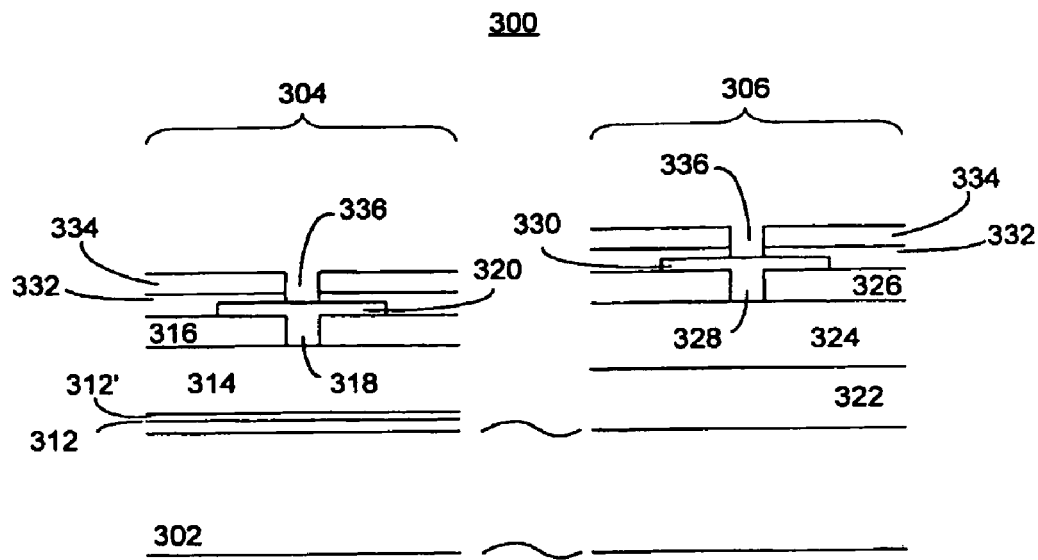

In FIG. 4E, an etch-stop layer (ESL) and an IMD layer are sequentially formed on first metal patterns 320 and 330 and exposed portions of ILD layers 316 and 326. The IMD layer is cured by e-beam to achieve an extra low dielectric constant, e.g., below 2.5. The etch-stop layer and the IMD layer are then patterned to form ESL 332, IMD layer 334, and first vias 336.

Figure 4F:
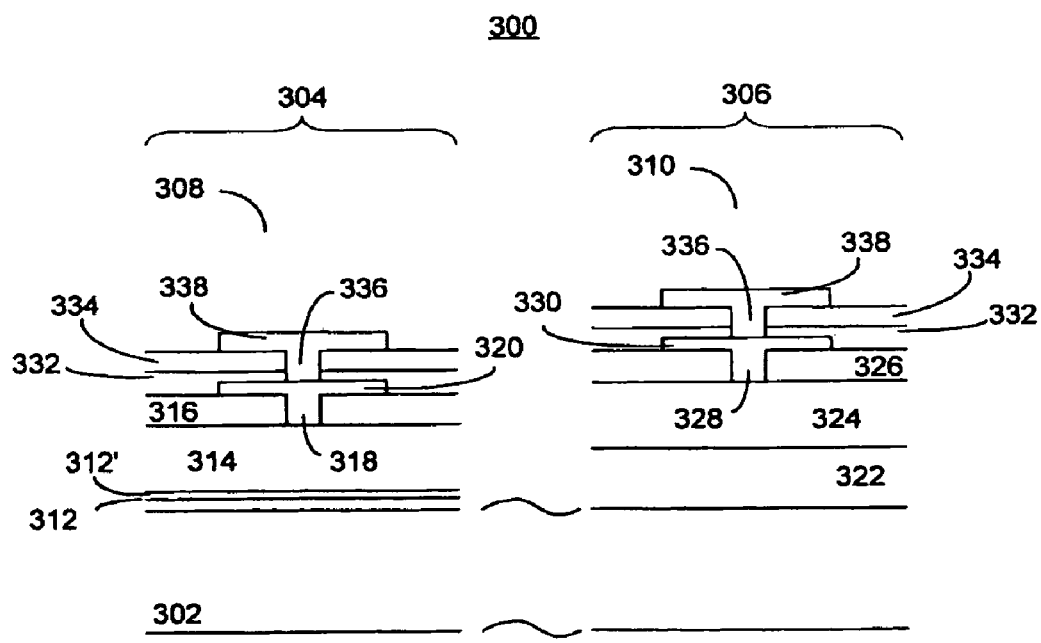

Subsequently, as shown FIG. 4F, a second metal layer is deposited on IMD layer 334 and filled in first vias 336, and patterned to form second metal patterns 338.

Conventional steps may be performed before, between, or after the steps illustrated in FIGS. 4A-4F to complete semiconductor device 300, such as formation of source and drain regions, formation of additional metal layers, and packaging, etc.

As discussed above, when the plasma nitridation process is performed, I/O oxide 322 is covered by polysilicon pattern 324A. Therefore, I/O oxide 322 is not nitrided and no sub-oxide formation occurs at the interface between semiconductor substrate 302 and I/O oxide 322. In other words, pure oxide is used as the gate oxide of peripheral transistor 310, and the subsequent e-beam curing process of IMD layer 334 does not result in BEOL PID to I/O oxide 322.

In the above illustrations of FIGS. 4A-4F, only one core transistor 308 and one peripheral transistor 310 were described. However, it is to be understood that a semiconductor device consistent with embodiments of the present invention may comprise more than one core transistors and/or more than one peripheral transistors. The formation of such other core transistors and peripheral transistors is similar to the formation of core transistor 308 and peripheral transistor 310, respectively. For example, if there are more than one core transistor 308, each core transistor may include one of a plurality of core oxide patterns 312 and one of a plurality of polysilicon patterns 314. Similarly, if there are more than one peripheral transistor 310, each peripheral transistor 310 may include one of a plurality of I/O oxide patterns 322 and one of a plurality of polysilicon patterns 324. A plurality of polysilicon patterns 324A may each be formed to cover one I/O oxide pattern 322 during the plasma nitridation process.

Figure 5A:
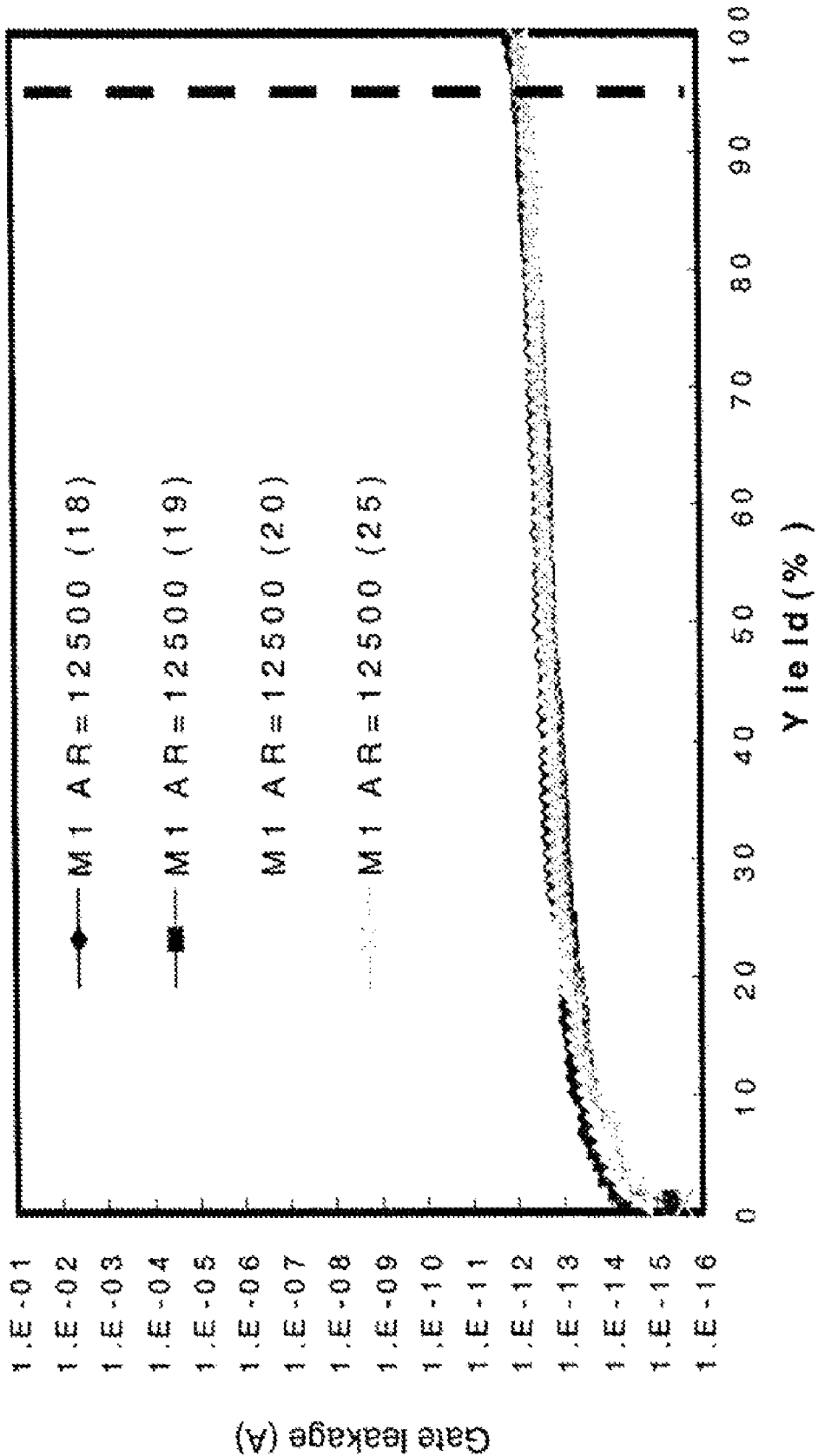
FIGS. 5A-5B show gate leakage currents of MOS transistors formed using the process consistent with embodiments of the present invention.
Figure 5B:
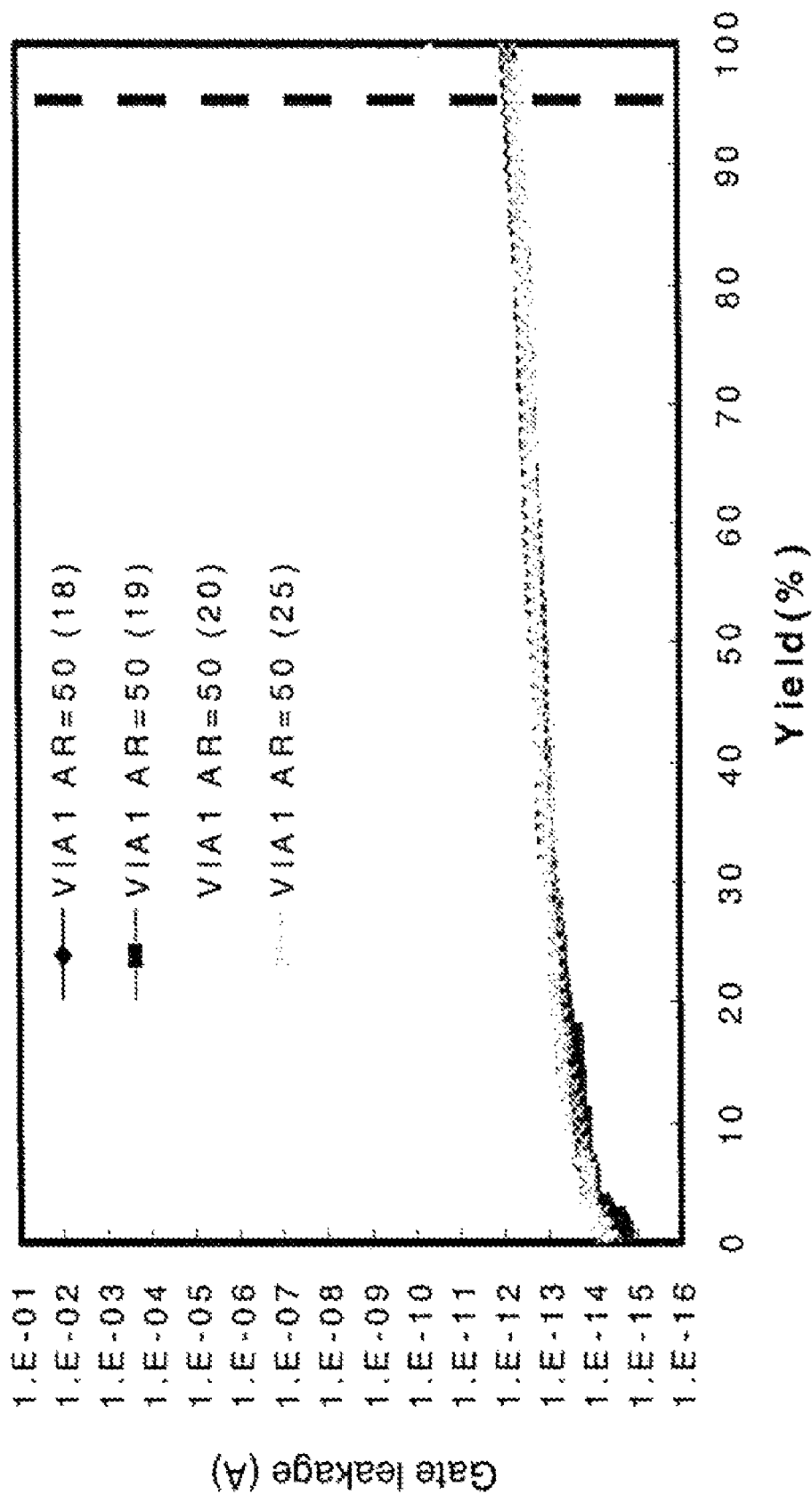

Peripheral transistors similar to peripheral transistor 310 as shown in FIG. 3 have been manufactured and performance thereof has been measured. FIGS. 5A and 5B show gate leakage currents of peripheral MOS transistors formed using the process consistent with embodiments of the present invention. In both FIGS. 5A and 5B, the peripheral MOS transistors have a nominal operation voltage of 2.5V, the abscissa is yield, and the ordinate is the gate leakage current. The numbers, 18, 19, 20, and 25 refer to the batch numbers of the MOS transistors formed. A dashed vertical line indicates acceptable yield (approximately 95%) in each of FIGS. 5A and 5B. In FIG. 5A, the antenna ratio (AR) of first metal pattern 330 is 12500. In FIG. 5B, the AR of first via 336 is 50. As shown in FIGS. 5A and 5B, no tailing of the gate leakage current occurs above the acceptable yield.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for forming a semiconductor device, comprising:
   providing a semiconductor substrate;
   defining a core area of the semiconductor substrate for core circuits and a peripheral area for peripheral circuits;
   forming and patterning a first layer of oxide to form a core oxide on the semiconductor substrate in the core area;
   forming and patterning a second layer of oxide to form an I/O oxide on the semiconductor substrate in the peripheral area;
   forming a polysilicon pattern on the I/O oxide; and
   nitridizing the core oxide by performing a plasma nitridation process using the polysilicon pattern on the I/O oxide as a mask.

2. The method of claim 1, further comprising performing a post-oxidation anneal in a nitric oxide (NO) environment after forming the polysilicon pattern.

3. The method of claim 1, wherein forming the first layer of oxide comprises forming the first layer of oxide to a thickness of about 10-20 .ANG.

4. The method of claim 1, wherein forming the second layer of oxide comprises forming the second layer of oxide to a thickness of about 50 .ANG.

5. The method of claim 1, further comprising:
   forming a layer of polysilicon on both the core oxide and the I/O oxide;
   patterning the layer of polysilicon to form a first polysilicon gate on the core oxide and, together with the polysilicon pattern, to form a second polysilicon gate on the I/O oxide;
   forming a layer of inter-layer dielectric (ILD) on the first and second polysilicon gates;
   forming contact holes in the layer of ILD;

forming a first metal layer on the layer of ILD and in the contact holes;

patterning the first metal layer to form a first metal pattern for providing contact through one of the contact holes to the first polysilicon gate and a second metal pattern for providing contact through another of the contact holes to the second polysilicon gate;

forming an etch stop layer (ESL) on the first metal pattern and the second metal pattern; and forming a layer of inter-metal dielectric (IMD) on the ESL.

6. The method of claim 5, further comprising curing the layer of IMD with e-beam.

7. The method of claim 5, wherein forming the layer of IMD comprises forming a layer of organosilicate glass (OSG).

8. The method of claim 5, further comprising:

forming vias in the layer of IMD and the ESL;

forming a second metal layer on the layer of IMD and in the vias; and patterning the second metal layer to form a third metal pattern for providing contact through one of the vias to the first metal pattern and a fourth metal pattern for providing contact through another of the vias to the second metal pattern.

9. A method for forming a semiconductor device, comprising:

providing a semiconductor substrate;

defining a core area of the semiconductor substrate for core circuits and a peripheral area for peripheral circuits;

forming and patterning a first layer of oxide to form a plurality of core oxide patterns on the semiconductor substrate in the core area;

forming and patterning a second layer of oxide to form a plurality of I/O oxide patterns on the semiconductor substrate in the peripheral area;

forming a plurality of polysilicon patterns on the I/O oxide patterns;

performing a post-oxidation anneal in nitric oxide (NO) environment; and nitridizing the core oxide patterns by performing a plasma nitridation process using the polysilicon patterns as a mask.

10. The method of claim 9, wherein forming the first layer of oxide comprises forming the first layer of oxide to a thickness of about 10-20 .ANG., and wherein forming the second layer of oxide comprises forming the second layer of oxide to a thickness of about 50 .ANG.

11. The method of claim 9, further comprising:

forming and patterning a layer of polysilicon to form a plurality of first polysilicon gates on the core oxide patterns and, together with the polysilicon patterns, forming a plurality of second polysilicon gates on the I/O oxide patterns;

forming a layer of inter-layer dielectric (ILD) on the first and second polysilicon gates;

forming contact holes in the layer of ILD;

forming a first metal layer on the layer of ILD and in the contact holes;

patterning the first metal layer to form a plurality of first metal patterns for providing contact to the first and second polysilicon gates through the contact holes;

forming an etch stop layer (ESL) on the first metal patterns; and forming a layer of inter-metal dielectric (IMD) on the ESL.

12. The method of claim 11, further comprising curing the layer of IMD with e-beam.

13. The method of claim 11, further comprising:

forming vias in the layer of IMD and the ESL;

forming a second metal layer on the layer of IMD and in the vias; and patterning the second metal layer to form a plurality of second metal patterns for providing contact through the vias to the first metal patterns.

14. A method for forming a semiconductor device, comprising:

providing a semiconductor substrate;

forming and patterning a first layer of oxide to form a first oxide pattern on the semiconductor substrate in a first area;

forming and patterning a second layer of oxide to form a second oxide pattern on the semiconductor substrate in a second area;

forming a polysilicon pattern on the second oxide pattern; and nitridizing the first oxide pattern by performing a plasma nitridation process using the polysilicon pattern on the second oxide pattern as a mask, wherein the second oxide pattern is thicker than the first oxide pattern.

15. The method of claim 14, further comprising performing a post-oxidation anneal in a nitric oxide (NO) environment after forming the polysilicon pattern.

16. The method of claim 14, wherein a thickness of the first oxide pattern is about 10-20 Å.

17. The method of claim 14, wherein a thickness of the second oxide pattern is about 50 Å.

18. The method of claim 14, further comprising:

forming a layer of polysilicon on both the first and second oxide patterns;

patterning the layer of polysilicon to form a first polysilicon gate on the first oxide pattern and, together with the polysilicon pattern, to form a second polysilicon gate on the second oxide pattern;

forming a layer of inter-layer dielectric (ILD) on the first and second polysilicon gates;

forming contact holes in the layer of ILD;

forming a first metal layer on the layer of ILD and in the contact holes;

patterning the first metal layer to form a first metal pattern for providing contact through one of the contact holes to the first polysilicon gate and a second metal pattern for providing contact through another of the contact holes to the second polysilicon gate;

forming an etch stop layer (ESL) on the first metal pattern and the second metal pattern; and forming a layer of inter-metal dielectric (IMD) on the ESL.

19. The method of claim 18, further comprising curing the layer of IMD with e-beam.

20. The method of claim 18, further comprising:

forming vias in the layer of IMD and the ESL;

forming a second metal layer on the layer of IMD and in the vias; and patterning the second metal layer to form a third metal pattern for providing contact through one of the vias to the first metal pattern and a fourth metal pattern for providing contact through another of the vias to the second metal pattern.

* * * * *